United States Patent [19]

Grace et al.

[11] Patent Number: 5,115,209
[45] Date of Patent: May 19, 1992

[54] MULTIPLE YIG OSCILLATOR

[75] Inventors: Martin I. Grace; Richard E. Simmons, both of San Jose, Calif.

[73] Assignee: Wiltron Company, Morgan Hill, Calif.

[21] Appl. No.: 725,388

[22] Filed: Jun. 28, 1991

Related U.S. Application Data

[63] Continuation of Ser. No. 592,859, Oct. 4, 1990, abandoned.

[51] Int. Cl.⁵ .............................................. H03B 5/18
[52] U.S. Cl. ................................. 331/49; 331/96; 331/117 D; 331/177 R
[58] Field of Search .............. 331/46, 49, 56, 96, 331/107 DP, 107 P, 107 SL, 117 D, 177 R

[56] References Cited

U.S. PATENT DOCUMENTS

| | | | |
|---|---|---|---|
| 4,630,002 | 12/1986 | Leiba | 331/96 |
| 4,817,200 | 3/1989 | Tanbakuchi | 455/323 |
| 4,988,959 | 1/1991 | Khanna et al. | 331/117 D |

OTHER PUBLICATIONS

Data Sheet, Microsource, Inc., Model No. MCO-02-26-501, "Broadband Switched YIG Tuned Oscillators 2-26.5 GHz", May 1990.
Helszajn, "YIG Resonators and Filters", John Wiley & Sons, New York, 1985, pp. 1-16, 156-170 and 191-201.
Leung et al., "A 0.5 μm Silicon Bipolar Transistor for Low Phase Noise Oscillator Applications up to 20 GHz", 1985 IEEE MTT-S Digest, pp. 383-386.
Leung et al., "Downsized Bipolar Fires 20-GHz Oscillator", Microwaves & RF, Sep. 1985, pp. 163-165, 168.

Primary Examiner—Siegfried H. Grimm
Attorney, Agent, or Firm—Fliesler, Dubb, Meyer & Lovejoy

[57] ABSTRACT

YIG oscillator apparatus comprises both an FET-based YIG oscillator circuit and a bipolar transistor-based YIG oscillator circuit inside a single magnetic structure. Both YIG spheres are disposed in the single air gap of the magnetic structure, which is defined by a pole piece which is tapered to an elongated pole surface which is only slightly larger than necessary to cover both YIG spheres.

20 Claims, 3 Drawing Sheets

MULTIPLE YIG OSCILLATOR

This application is a continuation of Ser. No. 07/592,859, filed Oct. 4, 1990, now abandoned.

BACKGROUND

1. Field of the Invention

The invention relates to YIG resonant circuits.

2. Description of Related Art

A YIG resonator is a magnetic insulator which resonates at a microwave frequency when placed in a magnetic field. If the resonator is spherical, the frequency of resonance is related only to the strength of the magnetic field and not to the radius of the sphere. YIG resonators usually have a radius between 0.5 mm and 1.0 mm, and are usually made of either single-crystal yttrium iron garnet or gallium-substituted yttrium iron garnet, both of which are referred to herein as "YIG." General background material on YIGs and YIG circuits can be found in J. Helszajn, "YIG Resonators and Filters," John Wiley & Sons (New York: 1985), incorporated by reference herein.

YIG resonators are used in several different types of microwave circuits, including filters, limiters and oscillators. The present invention, while usable with certain other types of microwave circuits, is useful primarily in tuned oscillator circuits.

In a generalized oscillator circuit, a reactive component is coupled to an active device which incorporates feedback. Feedback may be either series or parallel. For example, if the active device is an FET, then common source, common gate, and common drain configurations are possible, all of which may incorporate either series or parallel feedback. These configurations are shown at page 193 of Helszajn. In a YIG oscillator, a YIG sphere is used as a reactive component, and it is placed in a magnetic field to set its resonant frequency. As used herein, a reactive component need not be purely reactive; it can include some resistance as well.

For a tunable YIG oscillator, the YIG sphere is placed in the air gap of an electromagnet, and the current applied to the windings is varied as desired in order to obtain the desired frequency of oscillation. The electromagnet usually has a re-entrant cylindrical shape comprising a closed cylindrical magnetic shell having a pole piece extending inwardly from one end. A second pole piece may extend inwardly from the opposite end of the shell toward the first pole piece, but this is not essential. The end of the first pole piece defines a first pole surface, and the end of the second pole piece (or if there is no second pole piece then the other end of the magnetic shell itself) constitutes a second pole surface. The winding for the electromagnet is wrapped around at least one of the pole pieces. The first pole surface has a circular shape with a radius slightly larger than that of the YIG sphere, in order to ensure that the sphere is magnetized by a uniform magnetic field. The two pole surfaces are oriented parallel to each other for the same reason. The pole piece is usually cylindrical in shape, and tapers near its end to the size of the circular pole surface.

In the past, YIG oscillators have employed either an FET or a bipolar transistor as the active device coupled to the YIG resonator. FETs can operate to much higher frequencies than bipolar transistors can, but bipolar transistors have significantly better noise characteristics. Thus, if a designer needed a YIG oscillator tunable within a lower frequency range, for example 2-8 GHz, a bipolar transistor-based oscillator would be chosen. But if an oscillator tunable within a higher frequency range, for example 8-20 GHz, was desired, an FET-based oscillator would be chosen instead. No single broadband device has been available which can be tuned to frequencies with both the bipolar and FET microwave frequency ranges. Attempts have been made to increase the high frequency limit of bipolar transistor-based YIG oscillators by increasing the high frequency limit of the transistors, but these transistors also tended to have higher minimum frequencies of operation. See, for example, Leung, "A 0.5 μm Silicon Bipolar Transistor for Low-Phase Noise Oscillator Applications Up to 20 GHz," 1985 IEEE MTT-S Digest, pp. 383-386, and Leung, "Downsized Bipolar Fires 20 GHz Oscillator," Microwaves & RF (September 1985), pp. 163-168. Similarly, though FET-based YIG oscillator circuits can be designed to operate at either low or high frequencies, it is difficult to design a single circuit which can be tuned over the entire broadband. Thus, there is a need for broadband tuned YIG oscillators in a single device.

SUMMARY OF THE INVENTION

It is therefore an object of the present invention to provide a broadband YIG tuned oscillator.

It is another object of the present invention to provide a single YIG oscillator device which displays the advantages of bipolar transistor-based YIG oscillators at lower frequencies and the advantages of FET-based YIG oscillators at higher frequencies.

According to the invention, roughly stated, a broadband YTG tuned oscillator is obtained by combining two YIG oscillator circuits in a single housing with both YIG spheres being disposed in the same magnetic structure. The first circuit may be an FET-based oscillator circuit while the second circuit is a bipolar transistor-based oscillator circuit. The outputs of the two circuits are switchably coupled to an output terminal to enable the user to select the output of the bipolar transistor-based oscillator for lower frequencies and the output of the FET-based oscillator for higher frequencies. The current applied to the coil for the sole electromagnet determines the frequency output of both oscillator circuits.

BRIEF DESCRIPTION OF THE DRAWINGS

The invention will be described with respect to particular embodiments thereof, and reference will be made to the drawings, in which.

DETAILED DESCRIPTION

Figure 1:
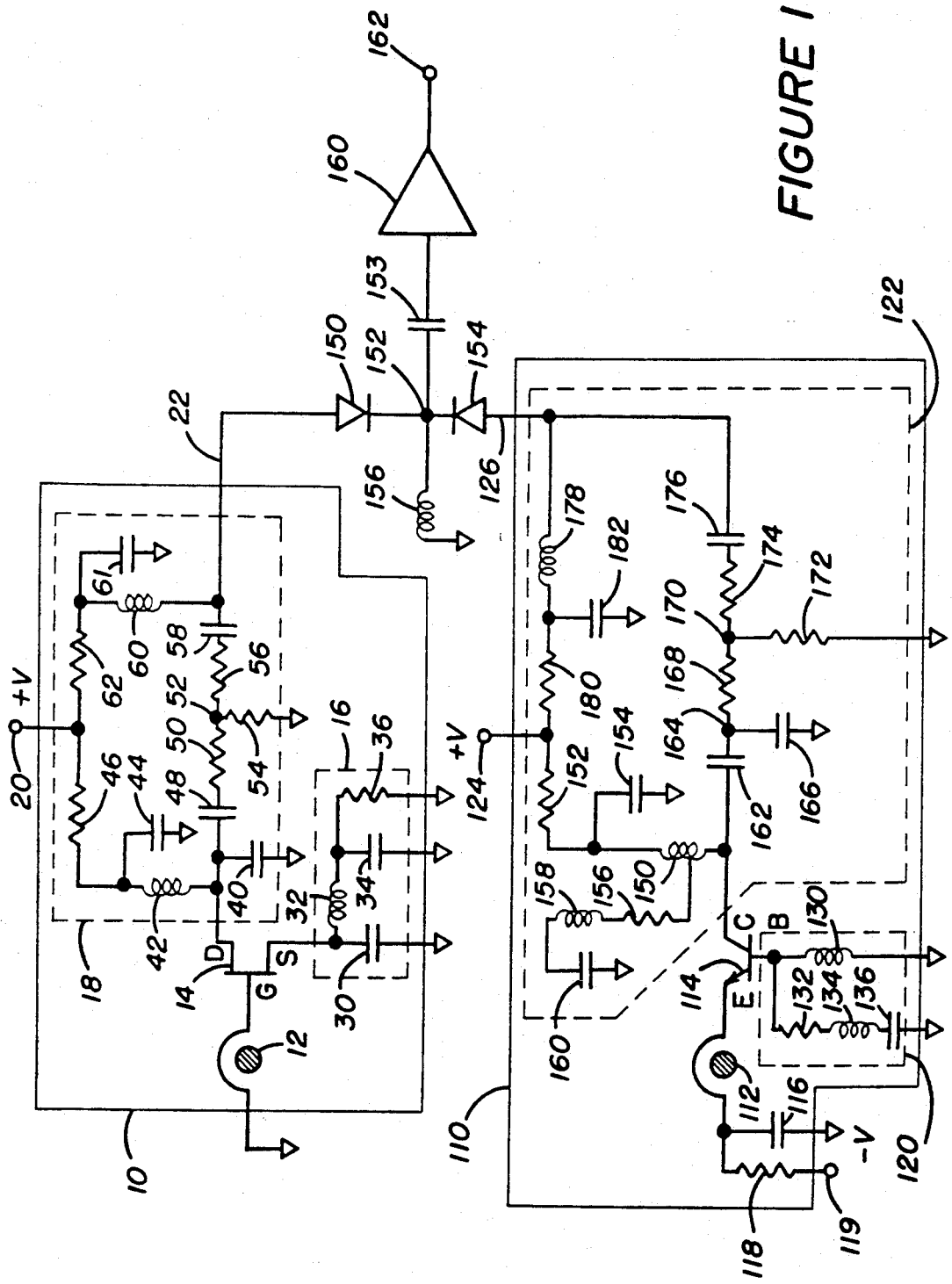
FIG. 1 is a schematic diagram of apparatus according to the invention.

A broadband YIG oscillator device according to the invention is shown in circuit schematic in FIG. 1. It comprises a first, FET-based, YIG oscillator circuit 10, in which a YIG sphere 12 is coupled between ground and the gate terminal of an FET 14. The source of the FET 14 is connected through a feedback network 16 to ground, and the drain of FET 14 is connected through a bias and matching network 18 to a first positive terminal 20 and to ground. An output 22 of the bias and matching network 18 forms the output of the oscillator circuit 10. Though the drain and source of FET 14 are shown specifically in FIG. 1, it will be understood that because of the equivalence between these two terminals of an FET, the two terminals may be interchanged for certain circuits. Both the drain and the source terminals of an FET are referred to herein as "current path terminals."

The feedback network 16 comprises a capacitor 30 coupled between the source of FET 14 and ground. The source is also connected to one terminal of an inductor 32, the other terminal of which is connected a parallel combination of a capacitor 34 and a resistor 36, both of which are connected to ground.

The bias and matching network 18 includes a capacitor 40 coupled between the drain of the FET 14 and ground. The drain of FET 14 is also connected to one terminal of an inductor 42, the other terminal of which is connected through a capacitor 44 to ground and a resistor 46 to the positive supply terminal 20. The drain of FET 14 is also connected through the series combination of a capacitor 48 and the resistor 50 to a node 52. The node 52 is connected through a resistor 54 to ground and through the series combination of a resistor 56 and a capacitor 58 to the oscillator circuit output 22. The oscillator circuit output 22 is also connected through the series combination of an inductor 60 and a resistor 62 to the positive supply terminal 20. A capacitor 61 couples the junction between inductor 60 and resistor 62 to ground.

The apparatus of FIG. 1 also includes a bipolar transistor-based YIG oscillator 110, comprising a YIG sphere 112 coupled between the emitter of a bipolar transistor 114 and a node which is coupled through a capacitor 116 to ground and through a resistor 118 to a negative supply terminal 119. The base of transistor 114 is coupled through a feedback network 120 to ground, and the collector of transistor 114 is coupled through a bias and matching network 122 to a second positive supply voltage terminal 124 and to ground. An output 126 of the bias and matching network 122 also forms the output of the oscillator circuit 110.

The feedback network 120 comprises an inductor 130 coupled between the base of transistor 114 and ground, and the series combination of a resistor 132, an inductor 134, and a capacitor 136 also coupled between the base of transistor 114 and ground. The bias and matching network 122 includes the series combination of an inductor 150 and a resistor 152 coupled between the collector of transistor 114 and the positive supply terminal 124. A capacitor 154 is coupled between ground and the junction between inductor 150 and resistor 152. Inductor 150 is a tapped inductor, and the tap is connected through the series combination of a resistor 156, an inductor 158 and a capacitor 160 to ground.

The collector of transistor 114 is also coupled through a series capacitor 162 to a node 164, which is coupled through a capacitor 166 to ground. The node 164 is coupled through a resistor 168 to a node 170, which is coupled through a resistor 172 to ground. The node 170 is coupled through the series combination of a resistor 174 and a capacitor 176 to the output 126 of the oscillator 110. The output 126 of the oscillator 110 is also coupled through an inductor 178 and resistor 180 to the positive supply terminal 124, and the junction between inductor 178 and resistor 180 is coupled through a capacitor 182 to ground.

Both the FET 14 and the bipolar transistor 114 should be operable within microwave frequencies and should exhibit low noise. It will be seen, however, that neither needs to have optimum characteristics over a very large bandwidth. An example of a satisfactory FET is the JS8818 made by Toshiba, and an example of a satisfactory bipolar transistor 114 is No. 567 made by NEC.

The output 22 of the FET-based YIG oscillator circuit 10 is coupled to the anode of a PIN diode 150, the cathode of which is connected to a node 152. Similarly, the output 126 of the bipolar transistor-based YIG oscillator circuit 110 is connected to the anode of a diode 154, the cathode of which is connected to the node 152. The node 152 is coupled through an inductor 156 to ground, and forms an AC-coupled input to an MMIC amplifier 160 through capacitor 153. The output of the amplifier 160 is the output of the apparatus of FIG. 1.

The operation of each one of the oscillator circuits 10 and 110 is conventional and will not be described in detail here. It should be noted, however, that the bias and feedback arrangement 18 is such as to introduce a positive DC component on the output line 22 so as to prevent the minimum voltage of the signal from falling below the threshold voltage of diode 150. Thus, as long as power is applied to the positive supply terminal 20 and the YIG resonator 12 is oscillating, the oscillations generated by the oscillator circuit will reach the node 152.

Similarly, the bias and matching network 122 in the oscillator circuit 110 introduces an appropriate positive DC component to ensure that as long as a positive supply voltage is applied to the terminal 124 and the YIG resonator 112 is oscillating, the oscillating signal from circuit 110 will reach the node 152.

It should also be noted that the positive supply terminals 20 and 124 are separate and distinct, meaning that a positive supply voltage can be applied to one and not the other. In practice, a positive supply voltage should be applied to only one of these terminals at a time, in order to select which oscillator circuit will generate the signal which will be provided to the amplifier 160. The diode 150 or 154 coupling the unused oscillator circuit to node 152 will be reverse biased, thereby minimizing any effect which the unused oscillator circuit has on the output signal.

Figure 2A:
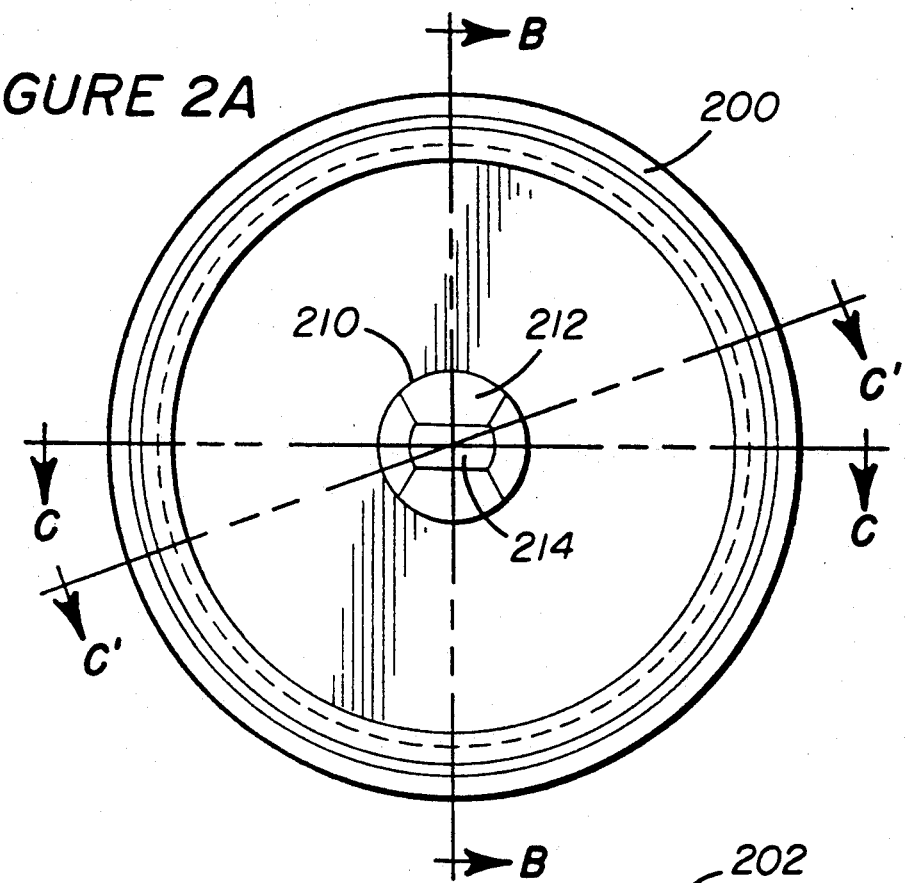
FIG. 2A is a top view of an electromagnet for use with the invention.
Figure 2C:
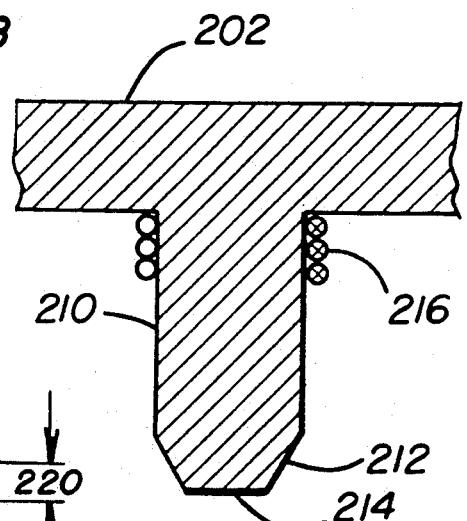
FIG. 2C is a cross sectional view of the electromagnet of FIG. 2A, taken along either lines C—C or C'—C'.
Figure 2B:
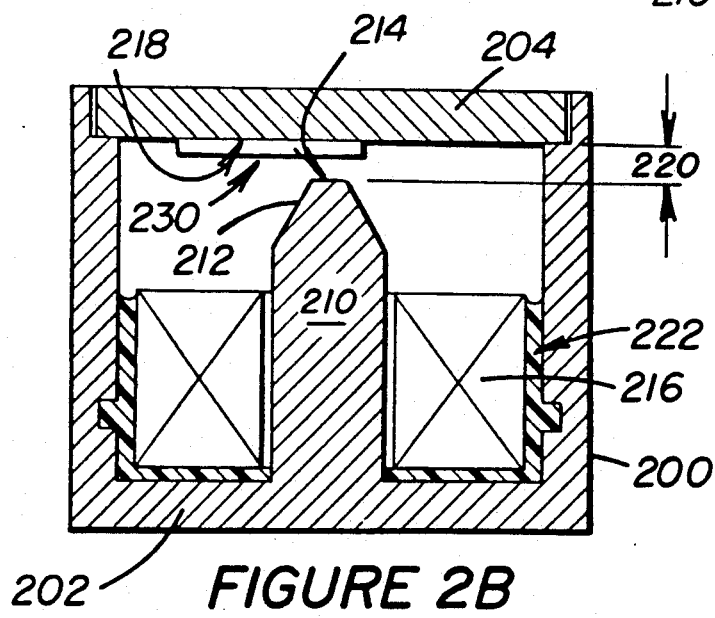
FIG. 2B is a cross sectional view of the electromagnet of FIG. 2A, taken along lines B—B.

The circuitry of FIG. 1 is all supported by single printed circuit board located inside an electromagnet which is shown in FIGS. 2A-2C. FIG. 2A shows a top view of the electromagnet, with the top cover removed. FIG. 2B shows a cross-section of the electromagnet, taken along lines B—B of FIG. 2A. FIG. 2C shows another cross-sectional view of the structure, taken along either lines C—C or C'—C' of FIG. 2A. The cylindrical shell of the electromagnet structure is omitted from FIG. 2C for clarity.

Referring to all of the FIGS. 2A-2C, the electromagnet comprises a cylindrical shell 200 which is closed on the bottom end by a bottom portion 202 and on the top end by a removable top cover 204. A pole piece 210 extends inwardly from the bottom portion 202. It is cylindrical in shape and includes a pole tip 212 which tapers to a pole surface 214. The pole surface 214 lies in a plane parallel to the top cover 204, and has an elongated shape for reasons which will become apparent below. The entire structure, including the cylindrical shell 200, the two ends 202 and 204, and the pole piece 210, is made of a ferromagnetic material such as Carpenter 49 and forms the core of the electromagnet. A winding 216, shown symbolically in FIGS. 2B and 2C, is wrapped around the pole piece 210. Thus, when the winding 216 is carrying current, the pole surface 214 and the inner surface 218 of the top cover 204 constitute a pair of magnetically opposite poles. An air gap 220 exists between and is defined by these two poles. Epoxy 222, shown only in FIG. 2B, holds the coil in place.

A printed circuit board 230 is disposed inside the electromagnet and is supported by the cover 204 in such a way that a portion of the printed circuit board is within the air gap 220.

Figure 3:
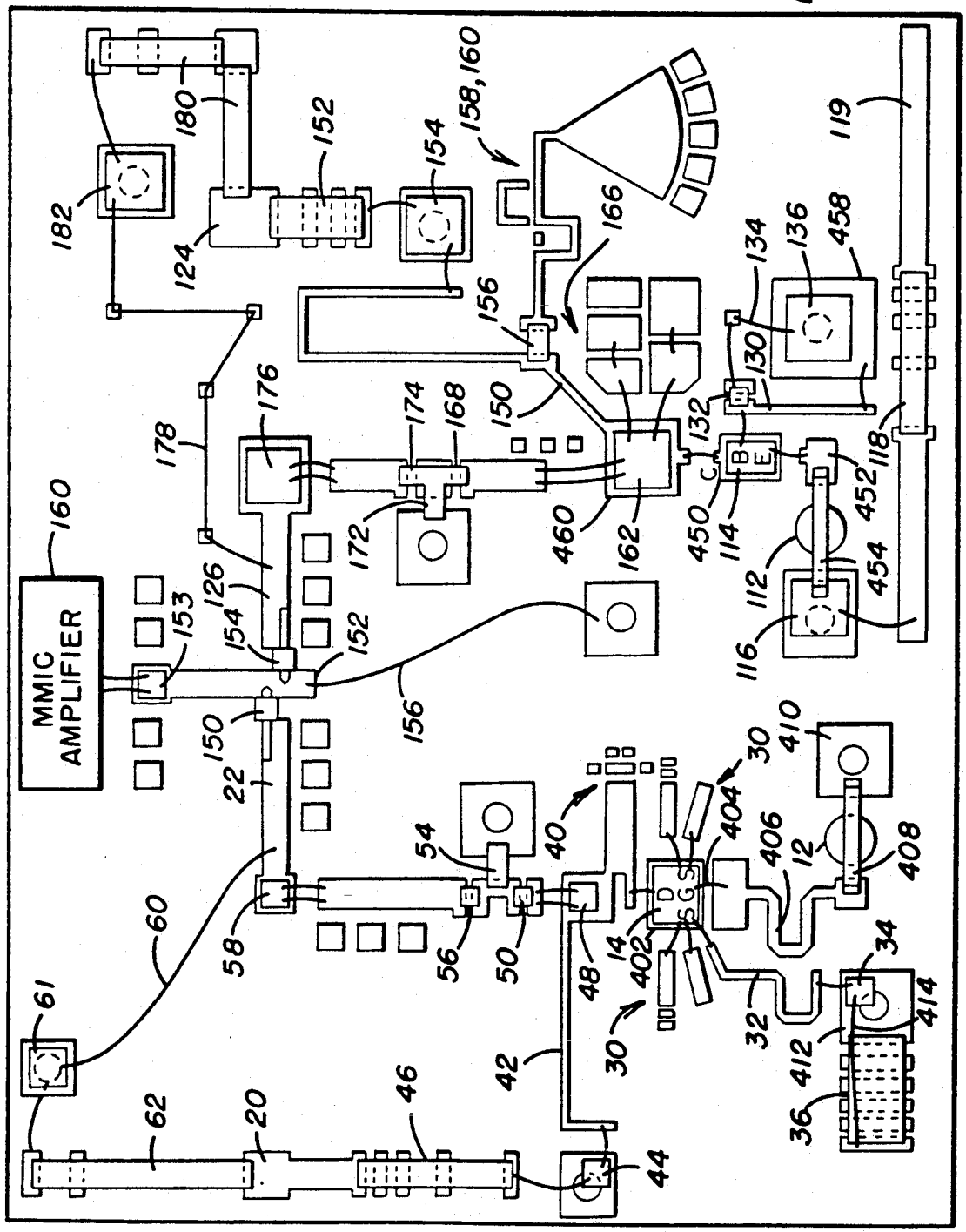
FIG. 3 is a layout diagram of portions of the circuit FIG. 1.

FIG. 3 shows the layout of the circuit of FIG. 1, as supported on the printed circuit board 230. The reverse side (not shown) of printed circuit board 230, is plated with a ground plane. Referring to FIG. 3, in which components are numbered the same as in FIG. 1, the layout for each respective one of the oscillators 10 and 110 is basically conventional. The FET transistor 14 is a chip bonded to a pad 402 on the printed circuit board. The gate terminal of the FET 14 is connected via a gold wire 404 and a meander line 406 to one terminal of a gold ribbon 408. The gold ribbon 408 loops over the YIG sphere 12 and connects at its other end to a pad 410 which feeds through and connects to the ground plane on the reverse side of the board. The YIG sphere 12 is held in place under the loop by a beryllium oxide rod (not shown).

The source terminals of FET 14 are coupled to the ground plane through the capacitor 30, which takes the form of four open-circuited transmission lines. The source terminals of the FET 14 are also coupled through the inductor 32 to the top surface of the chip capacitor 34. The bottom surface, which constitutes the opposite terminal of the capacitor 34, is bonded to a pad 412 which feeds through to the ground plane. The top surface of the chip capacitor 34 is also connected via a wire 414 to one end of the thin film resistor 36, the other end of which is connected to the ground plane via the pad 412.

The remaining components in the oscillator 10 are represented on the layout of FIG. 3 similarly to those already described, so the interconnections set forth above with respect to FIG. 1 will not be repeated.

In oscillator circuit 110, the bipolar transistor 114 is a chip having its bottom (collector) surface bonded to a pad 450. The base and emitter terminals of the transistor 114 are on the top surface of the chip. The emitter terminal is connected via a gold wire to a pad 452, to which is bonded one end of another gold ribbon 454. The gold ribbon 454 forms a loop over the second YIG resonator 112, and connects at its other end to the top surface of a capacitor 116, the bottom surface of which is connected to the ground plane on the reverse side of the board. The top surface of the capacitor 116 is also connected via a gold wire and the thin film resistor 118 to the negative voltage terminal 119. As with the sphere 12 in the first oscillator circuit, this sphere 112 in the second oscillator circuit is held in place by a beryllium oxide rod (not shown).

The base terminal of bipolar chip transistor 114 is connected by a gold wire to one end of the inductor 130, the other end of which is connected by a gold wire to a pad 458 which feeds through to the ground plane. The base of bipolar chip transistor 114 is also connected to one side of a thin film resistor 132, the other end of which connects via the inductor 134 and capacitor 136 to the ground plane via the pad 458.

The collector terminal of bipolar chip transistor 114, which is bonded to the pad 450, is connected via another gold wire to a pad 460 on which is bonded the chip capacitor 162. The top surface of the chip capacitor 162 is connected by gold wires to capacitor 166, which is formed by a plurality of pads on the top surface of the printed circuit board in combination with the ground plane on the reverse side. Any number of the pads on the top surface can be connected together electrically in order to appropriately tune the circuit.

The pad 460 is also connected to the tapped inductor 150, the tap of which is connected via a thin film resistor 156 to several structures which, in combination with the ground plane, provide the functions of both inductor 158 and capacitor 160.

As with the oscillator circuit 10, the remainder of the structures shown on the PC layout of FIG. 3 for oscillator circuit 110 correspond to, and are numbered identically with, the circuitry shown in FIG. 1, and, therefore, will not be further described here.

Though the two YIG spheres, 12 and 112, appear separated by a substantial distance in FIG. 3, the scale is such that the two spheres are actually disposed near each other on the printed circuit board. This places them both within the same air gap 220 shown in FIG. 2B. The printed circuit board 230 is positioned within the electromagnet such that a projection of the two spheres onto the pole surface 214 lies entirely within the elongated area of the pole surface 214. The pole surface 214 should be longer in its major axis than the distance between the opposite extremes of the two spheres as disposed on the board, and should be wider in it minor axis than the diameter of the larger of the two spheres. The dimensions of the pole surface 214 should be only slightly larger than necessary to cover both spheres, however. This permits the device to operate at higher frequencies without saturating, since the saturation frequency increases with decreasing volume of the air gap 220. Minimizing the area of pole tip 214 is one way of minimizing the volume of the air gap 220. It is for this reason that the pole tip 214 is not shaped simply as a circle large enough to encompass both spheres, which would be much easier to machine. The size and elongated shape of the pole surface 214 shown in FIG. 2A represents a unique way of achieving an optimum compromise between the desire to fully encompass both spheres, to ensure a uniform magnetic field through them; the desire to minimize the pole surface area necessary to fully encompass the spheres; and simplicity of manufacture.

Figure 4:
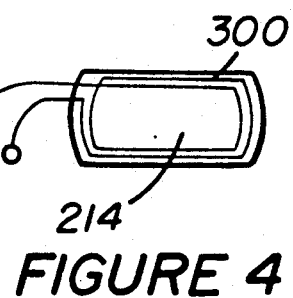
FIG. 4 is an enlarged view of the pole surface of the electromagnet of FIG. 2.

The positive voltage supply terminals 20 and 124, the negative voltage supply terminal 119, the ground terminal and the oscillator output 162, all pass through holes (not shown) in the cover 204 of the electromagnet and are available externally. The terminals of the coil 216 also pass through holes (not shown) in the cover 204 and are accessible externally. Further, FIG. 4 shows an enlarged view of the pole surface 214 of FIGS. 2A–2C. An auxiliary coil 300 is placed around the circumference of the pole surface, the two terminals of which also pass through holes (not shown) in the cover 204 of the electromagnet. The auxiliary coil 300 is useful for fine tuning or frequency modulation of the output signal.

The two oscillator circuits 10 and 110 are chosen because, as previously mentioned, it is desirable to use an FET-based circuit for higher frequencies and a bipolar-based circuit for lower frequencies. Thus the oscillator circuit 10 is designed to output a signal with a frequency which varies substantially linearly with the strength of the magnetic field containing the YIG sphere 12, in the frequency range of 8-20 GHz, whereas the oscillator circuit 110 is designed to output a signal having a frequency which varies substantially linearly with the strength of the magnetic field in the air gap 220 within the frequency range of about 2 to 8 GHz. There is an overlap of a few hundred MHz in the two frequency ranges to allow a tolerance for component variations. Thus, an external circuit can obtain any frequency in the broadband of 2-20 GHz desired, simply by applying power to the positive supply terminal 20 or 124 of whichever oscillator circuit better produces that frequency, and applying an appropriate current to the terminals of the coil winding 216. This is accomplished in a single electromagnetic structure, no larger than the more-narrow band electromagnetic structures of the prior art, and using circuit components which do not need to push the state of the art in order to maximize their bandwidth.

Preferably, the external circuit has previously followed a calibration procedure and set up a table which specifies both the current to be applied to the winding terminals and which oscillator circuit to power, for each desired output frequency.

It can be seen that the invention is not limited to use with only two YIG circuits, but may also be used with three or more YIG circuits if each is optimized for different frequency ranges. The invention can also be used with two or more YIG circuits which are not oscillator circuits, as long as each has its own characteristics which are optimized for different purposes. Nor must the YIG spheres be the same size.

The invention has been described with respect to particular embodiments thereof, and it will be understood that numerous modifications are possible within its scope.

We claim:

1. YIG apparatus having an apparatus output, comprising:
    a first circuit including as a component a first YIG resonator, said first circuit outputting a first signal having a first analog characteristic which varies as a first function of the strength of the magnetic field containing said first resonator;
    a second circuit including as a component a second YIG resonator, said second circuit outputting a second signal having a second analog characteristic which varies as a second function of the strength of the magnetic field containing said second resonator;
    magnetic field generating means for generating a single magnetic field, said first and second resonators both being disposed in said single magnetic field; and
    switch means for providing to said apparatus output an output signal responsive to selectably said first signal or said second signal.

2. Apparatus according to claim 1, wherein said first and second resonators are both spherical, wherein said first and second circuits are both oscillator circuits including said first and second resonators as reactive components in respectively said first and second oscillator circuits, and wherein said first and second analog characteristics are both frequency.

3. YIG oscillator apparatus having an apparatus output, comprising:
    a first oscillator circuit having an oscillator output and including as a component a first YIG resonator, said first oscillator circuit outputting a first oscillator signal having a frequency which is related to the strength of the magnetic field containing said first resonator by a first function;
    a second oscillator circuit having an oscillator output and including as a component a second YIG resonator, said second oscillator circuit outputting a second oscillator signal having a frequency which is related to the strength of the magnetic field containing said second resonator by a second function;
    magnetic field generating means for generating a single magnetic field, said first and second resonators both being disposed in said single magnetic field; and
    switch means for providing to said apparatus output an output signal responsive to selectably said first oscillator signal or said second oscillator signal.

4. Apparatus according to claim 3, wherein said first and second resonators are both spherical.

5. Apparatus according to claim 4, wherein said first function is substantially linear over a first range of output frequencies and said second function is substantially linear over a second range of output frequencies different from said first range of output frequencies.

6. Apparatus according to claim 5, wherein said first range of output frequencies partially overlaps said second range of output frequencies.

7. Apparatus according to claim 4, wherein said first oscillator circuit further includes an FET as an active component coupled to said first resonator and said second oscillator circuit further includes a bipolar transistor as an active component coupled to said second resonator.

8. Apparatus according to claim 4, wherein said switch means comprises:
    a first power supply terminal for applying power to said first oscillator circuit;
    a second power supply terminal, distinct from said first power supply terminal, for applying power to said second oscillator circuit; and
    means for providing to said apparatus output a signal responsive to both of said first and second oscillator signals.

9. Apparatus according to claim 8, wherein said means for providing comprises:
    an amplifier having an amplifier input and an output being said apparatus output;
    a first diode coupling said first oscillator output to said amplifier input; and
    a second diode coupling said second oscillator output to said amplifier input.

10. Apparatus according to claim 4, wherein said magnetic field generating means comprises an electromagnet having a winding, said winding having first and second terminals for applying a desired current thereto to control the strength of said single magnetic field.

11. YIG apparatus having an apparatus output node, said apparatus comprising:

a first oscillator circuit having a first output and including a first YIG sphere as a reactive component and an FET as an active component;

a second oscillator circuit having a second output and including a second YIG sphere as a reactive component and a bipolar transistor as an active component;

an electromagnet including a pair of winding terminals for applying a desired current thereto to control the strength of the magnetic field generated by said electromagnet, said first and second YIG spheres both being disposed in said magnetic field; and switch means for outputting selectably a signal from said first or second output signal on said apparatus output node.

12. Apparatus according to claim 11, further comprising a first positive supply terminal and a ground terminal, wherein said FET in said first oscillator circuit includes a gate and first and second current path terminals, and wherein said first oscillator circuit comprises:

means for coupling said gate of said FET to ground via said first YIG sphere;

means for coupling said first current path terminal to said first positive supply terminal via an impedance;

means for coupling said second current path terminal to ground; and means for coupling said first current path terminal to said first output.

13. Apparatus according to claim 11, further comprising a second positive supply terminal, a ground terminal and a negative supply terminal, wherein said bipolar transistor in said second oscillator circuit includes a base, a collector, and an emitter, and wherein said second oscillator circuit comprises:

means for coupling said emitter of said transistor to said negative supply terminal via said second YIG sphere;

means for coupling said base of said transistor to ground; and means for coupling said collector of said transistor to said second positive supply terminal via an impedance, and for coupling said collector of said transistor to said second output.

14. Apparatus according to claim 13, further comprising a first positive supply terminal, wherein said FET in said first oscillator circuit includes a gate and first and second current path terminals, and wherein said first oscillator circuit comprises:

means for coupling said gate of said FET to ground via said first YIG sphere;

means for coupling said first current path terminal to said first positive supply terminal via an impedance;

means for coupling said second current path terminal to ground; and means for coupling said first current path terminal to said first output.

15. Apparatus according to claim 14, wherein said switch means comprises:

a first diode having an anode coupled to said first output and a cathode coupled to said apparatus output node; and a second diode having an anode coupled to said second output and a cathode coupled to said apparatus output node, said first and second positive supply terminals being distinct to permit application of power to selectably said first or second oscillator circuits.

16. Apparatus according to claim 11, wherein said electromagnet comprises:

a magnetic core having first and second magnetically opposite pole surfaces, said core being shaped such that said first and second pole surfaces face each other and define an air gap there between, said first pole surface lying in a plane substantially parallel to said second pole surface;

a winding wrapping at least a portion of said magnetic core and electrically coupled between said pair of winding terminals; and support means for supporting said first and second YIG spheres in said air gap, at least said first pole surface having an elongated shape which is slightly larger than necessary to cover both said first and second YIG spheres as supported on said support means.

17. Apparatus according to claim 16, wherein said core forms a closed shell surrounding said air gap and includes a first pole piece extending inwardly to said air gap from said shell, said first pole surface being the free end of said first pole piece, said first pole piece being substantially cylindrical and tapering to said elongated shape of said first pole surface.

18. Apparatus according to claim 17, wherein said support means comprises a circuit board, said first and second oscillator circuits also being on said circuit board inside said closed shell.

19. Apparatus according to claim 16, further comprising an auxiliary coil shaped as, and attached to, the circumference of said first pole surface.

20. YIG apparatus having an apparatus output node, first and second positive supply terminals, a negative supply terminal, a ground terminal and a pair of winding terminals, said apparatus comprising:

a magnetic core forming a closed shell and having a first pole piece extending inwardly from said shell, the free end of said first pole piece constituting a first pole surface, said first pole piece being substantially cylindrical and tapering to the shape of said first pole surface, said core further having a second pole surface magnetically opposite said first pole surface, said first and second pole surfaces defining an air gap there between;

a winding wrapping at least a portion of said first pole piece and electrically coupled between said pair of winding terminals;

a circuit board disposed inside said closed shell and supporting first and second oscillator circuits, said first oscillator circuit having a first output and said second oscillator circuit having a second output, said first oscillator circuit including:
 a first YIG sphere,
 an FET having a gate and first and second current path terminals,
 means for coupling said gate of said FET to ground via said first YIG sphere,
 means for coupling said first current path terminal to said first positive supply terminal via an impedance,
 means for coupling said second current path terminal to ground, and
 means for coupling said first current path terminal to said first output;

said second oscillator circuit including:
 a second YIG sphere, a bipolar transistor having a base. a collector and an emitter, means for coupling said emitter of said transistor to said negative supply terminal via said second YIG sphere.

means for coupling said base of said transistor to ground. and means for coupling said collector of said transistor to said second positive supply terminal via an impedance. and for coupling said collector of said transistor to said second output:

said first and second YIG spheres being disposed proximately on said circuit board and inside said air gap. at least said first pole surface of said magnetic core having an elongated shape which is slightly larger than necessary to cover both said first and second spheres;

said circuit board further supporting a first diode have an anode coupled to said first output and a cathode coupled to said apparatus output node; and a second diode having an anode coupled to said second output and a cathode coupled to said apparatus output node, said first and second positive supply terminals being distinct to permit application of power to selectably said first or second oscillator circuits.

* * * * *

UNITED STATES PATENT AND TRADEMARK OFFICE
CERTIFICATE OF CORRECTION

PATENT NO. : 5,115,209
DATED : May 19, 1992
INVENTOR(S) : Martin I. Grace, Richard E. Simmons It is certified that error appears in the above-identified patent and that said Letters Patent is hereby corrected as shown below:

Column 9, line 15, delete "signal".

Signed and Sealed this

Twentieth Day of July, 1993

Attest:

MICHAEL K. KIRK

Attesting Officer

Acting Commissioner of Patents and Trademarks